United States Patent [19]

Vosteen

[11] 4,050,028
[45] Sept. 20, 1977

[54] HIGH VOLTAGE AMPLIFIER

[76] Inventor: Robert E. Vosteen, 1128 Archbald Road, Waterport, N.Y. 14571

[21] Appl. No.: 749,226

[22] Filed: Dec. 10, 1976

[51] Int. Cl.² .............................................. H03F 3/38
[52] U.S. Cl. ....................................... 330/10; 330/59
[58] Field of Search ......................... 330/9, 10, 51, 59

[56] References Cited

U.S. PATENT DOCUMENTS 3,825,846   7/1974   Grygera .............................. 330/10 X Primary Examiner—James B. Mullins
Attorney, Agent, or Firm—Finnegan, Henderson, Farabow & Garrett

[57] ABSTRACT

A first operational amplifier feeds a DC signal to first and second inverter means which are operated in opposite senses of polarity and which convert the DC output signal of the first operational amplifier to first and second stepped-up differential AC voltages at the same predetermined synchronized frequency. These stepped-up voltages are then converted to corresponding first and second DC voltages. A second operational amplifier is connected to the output of the first operational amplifier which drives a LED-photoconductor circuit to provide further system gain.

10 Claims, 3 Drawing Figures

HIGH VOLTAGE AMPLIFIER

BACKGROUND OF THE INVENTION

1. Field of the Invention

The invention relates to a high voltage operational amplifier and has particular utility in high voltage feedback of electrostatic voltmeters.

2. Description of the Prior Art

The prior art discloses the use of a high voltage operational amplifier having high frequency synchronized inverters in combination with a demodulator, which has excellent transient response but involves operating voltages exceeding twice the maximum output voltage. Note for example applicant's U.S. Pat. No. 3,887,877 for "Feedback Electrostatic Voltmeter." An operational amplifier having light sources optically coupled to photoconductor elements in the output circuit thereof is also disclosed in the art, as, for example, in applicant's U.S. Pat. No. 3,590,251. While the operational amplifier disclosed in this latter patent provides an efficient amplification technique whose output voltage capability can approach the supply voltage utilized, its speed-of-response is limited by the relatively slow speed-of-response of the available photoconductors.

SUMMARY OF THE INVENTION

The present invention cures the disadvantages of prior art operational amplifier techniques. It provides an operational amplifier system with reduced maximum supply voltage requirements and good small signal — up to one-half maximum output voltage — transient response.

In accordance with the invention, the desired transient response characteristics of fast inverter systems can be realized for excursions approximating one-half the maximum output capability, while the maximum output voltage capability thereof can also be realized. This provides a resultant system with a reduced maximum supply voltage requirement and good small signal (up to one-half voltage maximum output) transient response.

The system according to the invention is particularly useful with high voltage feedback electrostatic voltmeters in the range of 5KV and above, because it minimizes corona problems and maximizes efficiency, while still providing excellent transient response for changes up to 2.5KV. This is a desirable performance characteristic in such voltmeters.

The invention provides a first operational amplifier connected to feed first and second inverter means which are operable in opposite senses of polarity and which converts the DC output voltage of the first operational amplifier to first and second stepped-up differential AC voltages at the same predetermined synchronized frequency. These stepped-up voltages are then converted to corresponding first and second DC voltages.

A second operational amplifier is connected to the output of the first operational amplifier, and drives an LED/photoconductor circuit to provide further system gain. The relative gains provided by the inverter and LED/photoconductor circuits determine the overall gain of the system and its transient response characteristics.

The system according to the invention thus provides a high voltage operational amplifier which exhibits reduced maximum voltage and high electrical efficiency of the LED/phtoconductor circuit, and the fast speed-of-response of the high voltage inverter type of high voltage operational amplifier circuits.

DETAILED DESCRIPTION OF THE INVENTION

Figure 1:
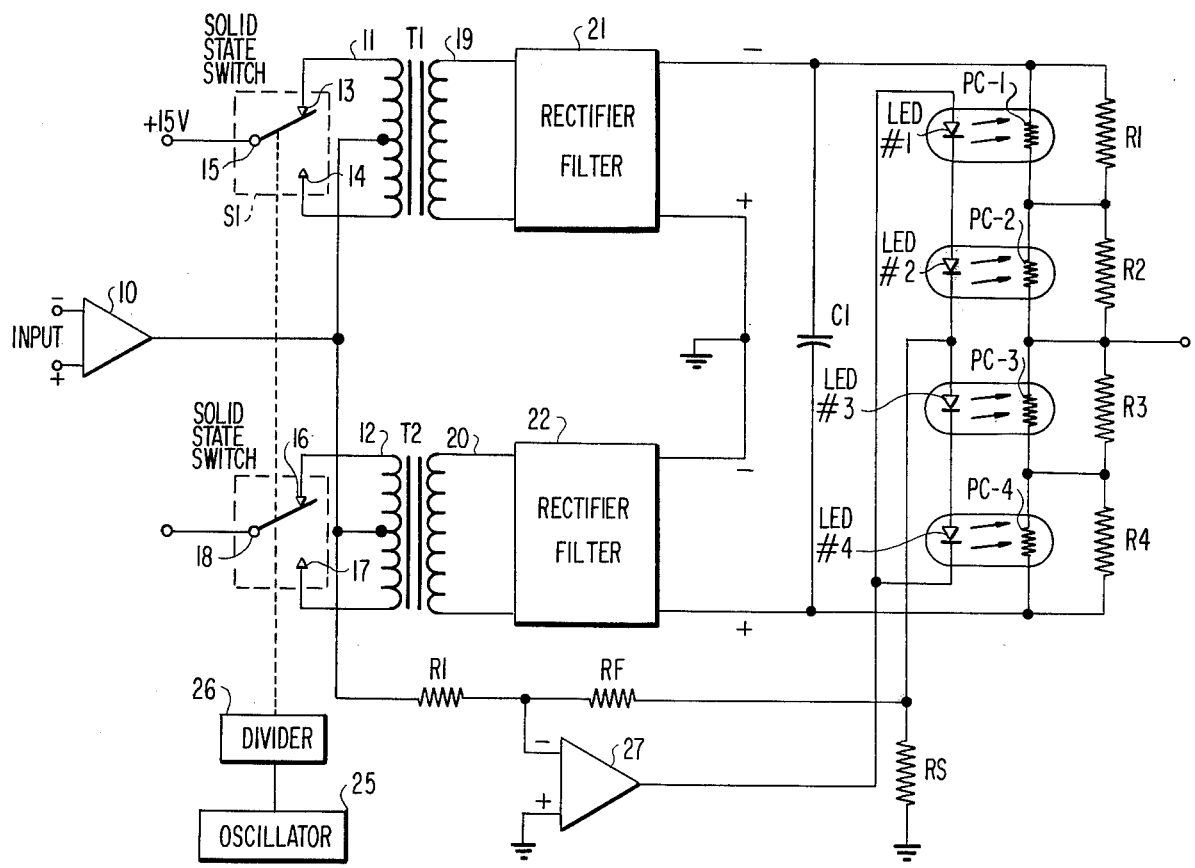
FIG. 1 is an electrical schematic diagram of a preferred embodiment of the operational amplifier system in accordance with the invention.

The high voltage operational amplifier system in accordance with a preferred embodiment of the invention is generally shown in FIG. 1.

The input to the system comprises a low-voltage operational amplifier 10, having + (plus) and − (minus) inputs. The output of operational amplifier 10 is connected to the midpoints of the primary windings 11 and 12 of the inverter transformers T1 and T2, which comprise part of the overall inverter circuitry described hereinafter. The ends of primary winding 11 are connected to outputs 13 and 14 of solid state switch S1, with the input 15 of switch S1 being connected to a positive source of supply. The function of the solid state switch is shown symbolically in FIG. 1 as being alternately operable to connect the positive source of supply to outputs 13 and 14. Such solid state switches are well-known and are readily available and are therefore not described in detail herein.

Similarly, the ends of primary winding 12 are connected respectively to outputs 16 and 17 of solid state switch S2, which has an input 18 connected to a negative source of supply. The positive and negative sources of supply are of equal amplitude, and in the illustrated example, are (+) and (−) 15 volts, respectively.

A high frequency RC square wave oscillator 25 is connected to drive a frequency divider 26 to provide a precise symmetrical drive for the solid state switches 1 and 2. For exemplary purposes only, the square wave oscillator 25 may operate at 50K Hz. The switches are thus alternately driven between their two operating conditions. In the first condition, switch S1 connects the positive supply through output 13 to the upper part of primary winding 11 while switch S2 simultaneously provides an output at 16 to the upper part of primary winding 12. During the alternate half-cycle output from the divider 26, switch S1 is driven to the second condition to provide an output at 14 to the lower part of primary winding 11 while, simultaneously, switch S2 is connected to apply an output at 17 to the lower part of primary winding 12.

The solid state switches S1 and S2 preferably exhibit a break-before-make characteristic as they switch between their two conditions. This maximizes inverter efficiency by reducing any tendency toward core saturation through the reduction of on time, and also prevents any possibility of simultaneous conduction of both halves of the inverter primary windings.

The inverter transformers T1 and T2 comprise step-up transformers of suitable ratio and convert the DC output voltage of operational amplifier 10 to stepped-up differential AC voltages at the same predetermined synchronized frequency. These AC voltages are applied to the rectifier/filter circuits 21 and 22, for conversion to corresponding DC voltages. If desired, a voltage multiplier may be used in conjunction with each of the rectifier/filter circuits to provide further multiplication of the AC voltages from the inverter transformers. This makes it possible to minimize the turns ratio of the inverter transformers, which results in simplified transformer design and minimum transformer corona.

One of the terminals of each of the rectifier/filters 21 and 22 is connected to circuit common, which does not necessarily have to be ground. Photoconductors PC1, PC2, PC3, and PC4 are connected in a series connection across the other output terminals of rectifier/filters 21 and 22.

The output of operational amplifier 10 is connected to the negative input of operational amplifier 27 through resistor R1, and the positive input of operational amplifier 27 is connected to circuit common. The output of operational amplifier 27 is connected in parallel to oppositely polarized light sources, preferably comprising LED's. The first circuit thus comprises LED's 1 and 2, and the second circuit comprises LED's 3 and 4. The return path for these connections is through sensing resistor $R_S$ to circuit common. Current feedback for the operational amplifier circuit is provided through resistor $R_F$, which enables the operational amplifier to function as an inverting current amplifier, as is generally known to those skilled in the art.

LED's 1 through 4 are respectively optically coupled to PC's 1 through PC 4 as shown in FIG. 1. Photocells PC1 through PC4 have resistance values which vary inversely with the amount of light applied thereto. It is evident that there should be excellent high voltage isolation between the LED's and the photoconductor.

An LED/photoconductor series is shown in FIG. 1 wherein each circuit comprises two photocells. By using series of cell configurations, the output voltage capability can significantly exceed the cell voltage rating as long as the LED to photocell rating is not exceeded. For increased power dissipation characteristics, additional photoconductors may be connected in parallel with those shown in FIG. 1. On the other hand, for increased voltage capability, additional photoconductors can be connected in series with those shown in FIG. 1.

The driver for the LED's as discussed above, comprises an inverting current amplifier which functions as a current source for the series connected LED light sources such that the LED's 3 and 4 are powered when the driver's output is negative, and LED's 1 and 2 are powered when the driver's output is positive. The diode conduction nature of an LED prevents its conduction when a reverse voltage is fed thereto, while the oppositely polarized LED circuit, when conducting, prevents feeding of an excessive voltage to the reverse bias LED circuit.

The relative resistance values of resistors $R_F$ and $R_S$ are selected such that the current output at the LED's is divided into a suitable relation between $R_F$ and $R_S$. Normally, the resistance value of $R_S$ would be smaller than $R_F$. The circuit resistor $R_S$ senses the current in the LED's and sets the voltage available to be fed back to the (−) minus input of operational amplifier 27 through $R_F$. The fed back voltage is thus responsive to the LED current, rather than to the voltage across the LED's. This provides a distinct advantage in that a linear relationship exists between the input voltage applied to operational amplifier 27 and the current flowing in the LED's, and therefore provides a nearly linear relationship between the input voltage to operational amplifier 27 and the light emitting from the LED's.

The operation of the operational amplifier system disclosed in FIG. 1 will now be detailed. The input to the upper and lower inverter transformers is assumed to be +15 volts and −15 volts, respectively. If it is assumed, for exemplary purposes, that the inverter circuits have a step-up value of 200, the upper inverter's DC output at the output of rectifier/filter 21 would be 3KV with the negative polarity as indicated, and the lower inverter's DC output at the output of filter/rectifier 22 would be 3KV with the positive polarity indicated. With zero output voltage from operational amplifier 10, the output of operational amplifier 27 would also be zero, and consequently none of the LED's would conduct.

Now assume a +10 volt output at operational amplifier 10. The upper inverter DC input would then be (15−10) or 5 volts, while the lower inverter input would be (15+10) or 25 volts. The upper inverter output would then be (200×5) or 1000 volts while the lower inverter output would be (200×25) or 5000 volts. In the absence of the LED's, the output from the system would be +2KV.

With the LED/photoconductor cell circuit added, as shown in FIG. 1, the value of feedback resistor $R_F$ may be chosen to derive the desired gain from the LED/photoconductor circuit. Thus, if it is desired to split system gain approximately equally between the inverter circuit and the LED/circuit, photoconductor $R_F$ is chosen to set the system output voltage to approximately +4KV, thereby providing each of the inverter and LED/photoconductor circuits with a 200 gain, and an acceptable system transient response. The relative gains provided by each of these circuits will, of course, affect system transient response; the greater the gain provided by the inverter circuit, the better the transient response. As another example, it therefore follows, assuming linear operation, that for a +12.5 volt input to the inverters, a +5KV output would be realized for an effective overall gain of 400, with 200 attributable to the inverter circuit and 200 attributable to the LED/PC circuit.

Capacitor C1 is connected between the (−) minus output of the upper inverter and the (+) plus output of the lower inverter. This will have a constant voltage of approximately 6KV across it [3−(−3)], as discussed above under the condition of zero output voltage from operational amplifier 10. This capacitor functions to improve the transient response of the inverter amplifier as follows:

Assume a step change from zero volts input to +10 volts. The lower inverter output will jump suddenly from +3KV to +5KV, as its AC output jumps by a proportional amount. Similarly, the upper inverter's AC signal drops in proportion to its DC input, but its rectifier/filter output cannot by itself drop this fast because, in the absence of the capacitor C described above, the rectifier/filter output can only decay at a rate dictated by the filter capacitance and the resistive load on this rectifier filter output. By adding capacitor C, having a capacitance approximately ten times the output capacitance of the rectifier/filter circuit, the charge on capacitor C is used to rapidly discharge the upper voltage on it, thus significantly improving transient response.

Resistors $R_1$ through $R_4$ respectively shunt photoconductors PC1 through PC4 and have a resistance significantly less than that value necessary to assure keeping the voltage of the off photoconductors within their reverse voltage ratings. This is required to insure that small transient output excursions near zero volts out will exhibit the fast transient behavior of the inverter circuit.

The system can also operate with an inverting LED cell driver which is responsive to the LED voltage by providing feedback through $R_F$. This is accomplished by connecting $R_F$ between the (−) minus input to operation amplifier 27 and its output, rather than to $R_S$.

Figure 2:
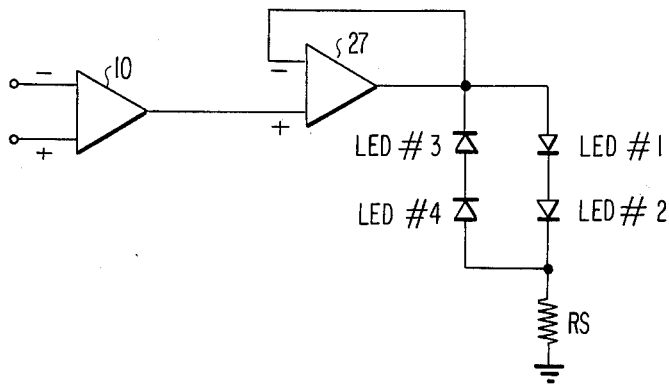
FIG. 2 is an electrical schematic diagram showing a variation of the operational amplifier system shown in FIG. 1.

Also, the invention encompasses the use of a non-inverting voltage feedback LED driver as shown in FIG. 2. There, elements similar to those shown in FIG. 1 are similarly numbered. Thus, PC1 through PC4 would be optically coupled to LED 1 through LED 4, and resistance R would be scaled to have a much higher resistance compared to the equivalent resistance of the LED's to linearize the output current versus input voltage characteristics. Also, the input to amplifier 27 would be made as large as possible without driving it into saturation.

Figure 3:
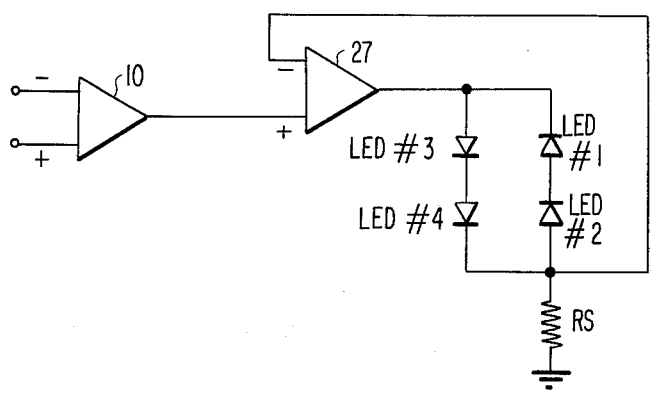
FIG. 3 is an electrical schematic diagram showing another variation of the operational amplifier system shown in FIG. 1.

In FIG. 3, a non-inverting LED cell driver providing current feedback is shown in accordance with the invention. Again elements similar to those shown in FIG. 1 are similarly numbered, and PC1 through PC4 are optically coupled to LED 1 through LED 4. A sensing resistor $R_S$ is connected between the common connection of the (−) minus input to operational amplifier 27 and the LED's and circuit common to sense the current flowing through the LED.

It should be evident to those skilled in the art that minor variations may be made in the disclosed embodiments without departing from the spirit and scope of the invention.

What is claimed:

1. A high voltage operational amplifier system comprising:
  a first operational amplifier,
  first and second inverter means operable in opposite senses of polarity and having their respective inputs connected to the output of the first operational amplifier to convert the DC output voltage of the first operational amplifier to first and second stepped-up differential AC voltages at the same predetermined synchronized frequency,
  first and second converter means to convert the first and second AC voltages to corresponding first and second DC voltages,
  first and second photoconductor means connected in series across the outputs of the first and second converter means,
  a second operational amplifier connected to function as an inverting amplifier having its (−) input connected to the output of the first operational amplifier through resistive means, and its (+) positive input connected to circuit common,
  first and second light source means connected to the output of the second operational amplifier, the first light source means being selectively energizable in response to a second operational amplifier output of one polarity and being optically coupled to the first photoconductor means, the second light source means being selectively energizable in response to a second operational amplifier output of the opposite polarity and being optically coupled to the second photoconductor means, the output of the amplifier system being between the series connection of the first and second photoconductor means and circuit common.

2. The high voltage operational amplifier system recited in claim 1 wherein the second operational amplifier is connected as an inverting current amplifier.

3. The high voltage operational amplifier as recited in claim 2 wherein the first and second inverter means each comprise a step-up transformer connected to the output of the first operational amplifier, and a rectifier/filter circuit connected between the output of the step-up transformer and the photoconductor means.

4. The high voltage operational amplifier as recited in claim 1 wherein the second operational amplifier is connected as an inverting voltage amplifier.

5. The high voltage operational amplifier as recited in claim 4 wherein the first and second inverter means each comprise a step-up transformer connected to the output of the first operational amplifier, and a rectifier/filter circuit connected between the output of the step-up transformer and the photoconductor means.

6. A high voltage operational amplifier system comprising:
  a first operational amplifier,
  first and second inverter means operable in opposite senses of polarity and having their respective inputs connected to the output of the first operational amplifier to convert the DC output voltage of the first operational amplifier to first and second stepped-up differential AC voltages at the same predetermined synchronized frequency,
  first and second converter means to convert the first and second AC voltages to corresponding first and second DC voltages,
  first and second photoconductor means connected in series across the outputs of the first and second converter means,
  a second operational amplifier connected to function as a non-inverting amplifier having its (−) minus input connected to its output and its (+) positive input connected to the output of the first operational amplifier,
  first and second light source means connected between the output of the second operational amplifier and circuit common, the first light source means being selectively energizable in response to a second operational amplifier output of one polarity and being optically coupled to the first photoconductor means, the second light source means being selectively energizable in response to a second operational amplifier output of the opposite polarity and being optically coupled to the second photoconductor means, the output of the amplifier system being between the series connection of the first and second photoconductor means and circuit common.

7. A high voltage operational amplifier as recited in claim 6 wherein a linearizing resistor is interposed between the first and second light source means and circuit common.

8. The high voltage operational amplifier as recited in claim 7 wherein the first and second inverter means each comprise a step-up transformer connected to the output of the first operational amplifier and a rectifier/filter circuit connected between the output of the step-up transformer and the photoconductor means.

9. A high voltage operational amplifier system comprising:

a first operational amplifier, first and second inverter means operable in opposite senses of polarity and having their respective inputs connected to the output of the first operational amplifier to convert the DC output voltage of the first operational amplifier to first and second stepped-up differential AC voltages at the same predetermine synchronized frequency, first and second converter means to convert the first and second AC voltages to corresponding first and second DC voltages, first and second photoconduct means connected in series across the outputs of the first and second converter means, a second operational amplifier connected to function as a non-inverting amplifier and having its (+) positive input connected to the output of the first operational amplifier, first and second light source means connected to the output of the second operational amplifier, the (−) minus input of the second amplifier being connected through the first and second light source means to the output of the second operational amplifier, the first light source means being selectively energizable in response to a second operational amplifier output of one polarity and being optically coupled to the first photoconductor means, the second light source means being selectively energizable in response to a second operational amplifier output of the opposite polarity and being optically coupled to the second photoconductor means, a sensing resistor connected between the (−) minus input of the second operational amplifier and circuit common to sense a voltage proportional to the LED current, the output of the amplifier system being between the series connection of the first and second photoconductor means and circuit common.

10. The high voltage operational amplifier as recited in claim 9 wherein the first and second inverter means each comprise a step-up transformer connected to the output of the first operational amplifier and a rectifier/filter circuit connected between the output of the step-up transformer and the photoconductor means.

* * * * *